(12) United States Patent
Kim

(10) Patent No.: US 8,807,527 B2
(45) Date of Patent: Aug. 19, 2014

(54) DOOR VALVE

(75) Inventor: Bae-Jin Kim, Suwon (KR)

(73) Assignee: Presys Co., Ltd., Suwon (KR)

( * ) Notice: Subject to any disclaimer, the term of this patent is extended or adjusted under 35 U.S.C. 154(b) by 0 days.

(21) Appl. No.: 13/511,637

(22) PCT Filed: Jun. 21, 2010

(86) PCT No.: PCT/KR2010/004000
§ 371 (c)(1),
(2), (4) Date: May 23, 2012

(87) PCT Pub. No.: WO2011/087190
PCT Pub. Date: Jul. 21, 2011

(65) Prior Publication Data
US 2012/0285094 A1 Nov. 15, 2012

(30) Foreign Application Priority Data

Jan. 18, 2010 (KR) .................. 10-2010-0004247

(51) Int. Cl.
- *F16K 25/02* (2006.01)
- *F16K 3/18* (2006.01)
- *F16K 31/122* (2006.01)
- *F16K 37/00* (2006.01)

(52) U.S. Cl.
USPC ............. 251/193; 251/62; 251/158; 251/175; 251/215; 137/553

(58) Field of Classification Search
USPC ........... 251/203, 158, 326, 62, 193, 175, 215; 137/553
See application file for complete search history.

(56) References Cited

U.S. PATENT DOCUMENTS

| 6,561,484 B2 * | 5/2003 | Nakagawa et al. ........... 251/175 |
| 2005/0139799 A1 | 6/2005 | Tomasch |
| 2007/0272888 A1 * | 11/2007 | Tichy .............................. 251/63 |
| 2008/0092960 A1 * | 4/2008 | Manecke et al. .............. 137/554 |

FOREIGN PATENT DOCUMENTS

| KR | 20-0380587 Y1 | 3/2005 |
| KR | 10-2005-0071931 A | 7/2005 |
| KR | 10-0772019 B1 | 10/2007 |
| KR | 10-2009-0112134 A1 | 10/2009 |

OTHER PUBLICATIONS

International Search Report for PCT/KR2010/004000 filed on Jun. 21, 2010.

* cited by examiner

*Primary Examiner* — Atif Chaudry

(57) ABSTRACT

An up and down operating actuator unit which manages upward and downward motions of an opening and closing member, and a forward and backward actuator unit which manages forward and backward motions of the opening and closing member are configured so that the opening and closing member, which opens and closes a wafer movement path, can be accurately operated in an "L"-shaped motion.

7 Claims, 20 Drawing Sheets

DOOR VALVE

TECHNICAL FIELD

The present invention relates to a door valve, and in particular to a door valve which makes it possible to allow an opening part opening and closing a wafer movement path to accurately work in a L-motion in such a way that an up and down operating actuator unit controlling the up and down operations of an opening and closing part and a forward and backward actuator unit controlling the forward and backward motions.

BACKGROUND ART

The same applicant as the present invention filed a slit valve with the Korean patent application number 10-2003-0071906 (title of the invention: slit valve) which makes it possible to prevent the damages of a sealing member sealing the motion path and to check out the operation state with the aid of an indicator device installed at a valve driving part by improving the arrangement structures of a sealing member arranged around the motion paths of the wafer.

FIG. 1 is a cross sectional view illustrating the slit valve of the conventional art. The conventional slit valve comprises a sealing member 100 opening and closing a wafer movement path, a housing bracket 200 formed separately from the sealing member 100, a main haft 400 extended between the sealing member 100 and the housing bracket 200, an air cylinder 310 formed in the interior of the housing bracket 200 and driven by means of the pressure of air, a piston 320 disposed in the interior of the air cylinder 310, a piston shaft 330 engaged to the piston 320, a moving unit 340 engaged to the piston shaft 330 and a valve driving part 300 having a link connected to the moving unit 340 and the main shaft 340.

The slit valve is characterized in that the piston 320 of the air cylinder 310 formed in the interior of the housing bracket 200 moves up and down depending on the change of pressure of the compressed air which is externally inputted, and the moving unit 340 moves up and down along the piston, and the main shaft 400 connected to the moving unit 340 via the link 350 is driven, thus opening and closing the wafer movement paths by the sealing member 100.

As shown in FIG. 2, the valve driving part 300 of the slit valve is driven by means of a first step operation in which the main shaft 400 is driven upward and downward in a vertical direction, and a second step operation in which a semiconductor wafer movement path is opened and closed by means of the sealing member 100 as the main shaft 400 is driven forward and backward in the vertical direction, in other words, it is driven in a L shape. The L-shaped guide groove is formed for a L-shape operation.

Since the link 350 structurally rotates, the L-shape of the conventional slit valve, namely, the guide groove of the straight trajectory is not enough for the precise L-shaped motion guide of the valve driving part 300.

As shown in FIG. 2, when the link 350 is guided by means of the L-shaped guide groove 351, a stress concentration occurs due to the repeated friction at the corner between the link and the guide groove. When the link rotates being inserted into the guide groove, as shown in FIG. 2, a small margin occurs, so it is hard to accurately control the operation of opening and closing the semiconductor wafer path.

A rubber O-ring is installed at the groove at the contact surface of the opening and closing member opening and closing the semiconductor wafer movement path by mean of the link. A small degree of rotation occurs at the upper side (or lower side) O-ring when the O-ring comes into contact with the semiconductor wafer movement path. So, the O-ring rotates being installed at the groove by means of the rotation of the O-ring, so it might escape from the groove, thus being hardened.

DISCLOSURE OF INVENTION

The present invention is made to resolve the above problems, and it is an object of the present invention to provide a door valve which makes it possible to allow an opening part opening and closing a wafer movement path to accurately work in a L-motion in such a way that an up and down operating actuator unit controlling the up and down operations of an opening and closing part and a forward and backward motion actuator controlling the forward and backward motions.

To achieve the above objects, there is provided a door valve, comprising an opening and closing member 100 which opens and closes a semiconductor wafer movement path; a forward and backward actuator unit 200 which comprises a first cylinder 210 which is installed at a back of the opening and closing member 100 and has a first flow path at an inner rear side, and a second flow path 2 at a front side, and a cover 221 installed at a front side; a first piston 220 which is installed in the interior of the first cylinder 210 and operates forward and backward by means of a compression air inputted into the first flow path and the second flow path; and a connection member B connecting the first piston 220 and the opening and closing member 100; and an up and down operating actuator unit 300 which comprises a plurality of second cylinders 310 formed in the interior; a second piston 320 which is installed in the interior of the second cylinder 310 and moves upward and downward by means of a compression air; an upper and lower shaft 330 one side of which is connected with the second piston 320, and the other side of which is connected with the forward and backward actuator unit 200, the compression air flowing in the interior, the upper and lower shaft being formed of a third flow path 3 communicating with the first flow path 1, and a fourth flow path 4 communicating with the second flow path 2; a first compression air inlet through hole 340 formed to receive the compression air when the wafer movement path of the opening and closing member 100 is closed; a fifth flow path 5 which is connected from the first compression air inlet through hole 340 to the lower side of the second cylinder 310 so that the second piston 320 can move upward by means of the compression air inputted from the first compression air inlet through hole 340; and a sixth flow path 6 in which a relief valve R1 selectively opened when the second piston 320 reaches the top dead point by means of a compression air inputted into the fifth flow path 5 and a check valve C1 selectively opened when the second piston 320 reaches the bottom dead point are installed, the sixth flow path coming to communicate with the first compression air inlet through hole 340, the fifth flow path 5 and the first flow path 1 so that the compression air can move to the first flow path when the relief valve R1 opens.

In addition, in order to achieve the above objects, there is provided a door valve, comprising an opening and closing member 100 opening and closing a semiconductor wafer movement path; a forward and backward actuator unit 200 which comprises a first cylinder 210 which is installed at a back of the opening and closing member 100 and has a first flow path at an inner rear side, and a second flow path 2 at a front side, and a cover 221 installed at a front side; a first piston 220 which is installed in the interior of the first cylinder 210 and operates forward and backward by means of a compression air inputted into the first flow path and the second flow path; a connection member B connecting the first piston 220 and the opening and closing member 100; and a rear cover 201 sealingly externally sealing the connection member B; and an up and down operating actuator unit 300 which comprises a plurality of second cylinders 310 formed in the interior; a second piston 320 which is installed in the interior of the second cylinder 310 and moves upward and downward by means of a compression air; and an upper and lower shaft 330 one side of which is connected with the second piston 320, and the other side of which is connected with the forward and backward actuator unit 200, the compression air flowing in the interior, the upper and lower shaft being formed of a third flow path 3 communicating with the first flow path 1, and a fourth flow path 4 communicating with the second flow path 2.

In addition, there are further provided a second compression air inlet through hole 350 which is formed to receive a compression air so that a wafer movement path can be open by means of the opening and closing member 100 and is installed at the up and down operating actuator unit 300 and communicates with the fourth flow path 4 and the second flow path 2; and a seventh flow path which communicates with the second compression air inlet through hole 350 and is formed of a relief valve R2 selectively opened when the first piston 220 reaches the bottom dead point by means of the compression air inputted into the second compression air inlet through hole 350, and a check valve C2 selectively opened when the first piston 220 reaches the bottom dead point and is formed for the compression air to input into the upper side of the second cylinder 320 when the relief valve R2 is open.

In addition, there are further provided a magnet member 321 installed at the second piston 32; and a magnet type sensor 360 which is installed at the up and down operating actuator unit 300 and detects the position of the second piston 320 by detecting the magnet member 321.

In addition, there is further provided a contact type sensor 361 which is installed at the up and down operating actuator unit 300 and detects the position of the second piton 320 as it comes into contact with the upper and lower surfaces of the forward and backward actuator unit 200 upwardly and downwardly moving by means of the up and down operating actuator unit 300.

In addition, there is further provided a bellows 400 which is installed between the opening and closing member 10 and the forward and backward actuator unit 200 and between the forward and backward actuator unit 200 and the up and down operating actuator unit 300.

In addition, there are further provided an upper cover 301 and a lower cover 302 which are provided at the upper and lower sides of the up and down operating actuator unit 300 for the purpose sealing the second cylinder 30; a guide part 303 which is formed at the upper cover 301 for guiding the upper and lower shaft 330; and a bushing 304 which is installed in the interior of the guide part 303 and comes into contact with the outer surface of the upper and lower shaft 330 and prevents the abrasion of the upper and lower shaft 330 and the guide part 303 when eccentric phenomenon occurs due to the weight of the opening and closing member 100.

In addition, the check valve is a quick exhaust valve.

ADVANTAGEOUS EFFECTS

The present invention makes it possible to allow an opening part opening and closing a wafer movement path to accurately work in a L-motion in such a way that an up and down operating actuator unit controlling the up and down operations of an opening and closing part and a forward and backward actuator unit controlling the forward and backward motions.

BEST MODES FOR CARRYING OUT THE INVENTION

Figure 1:
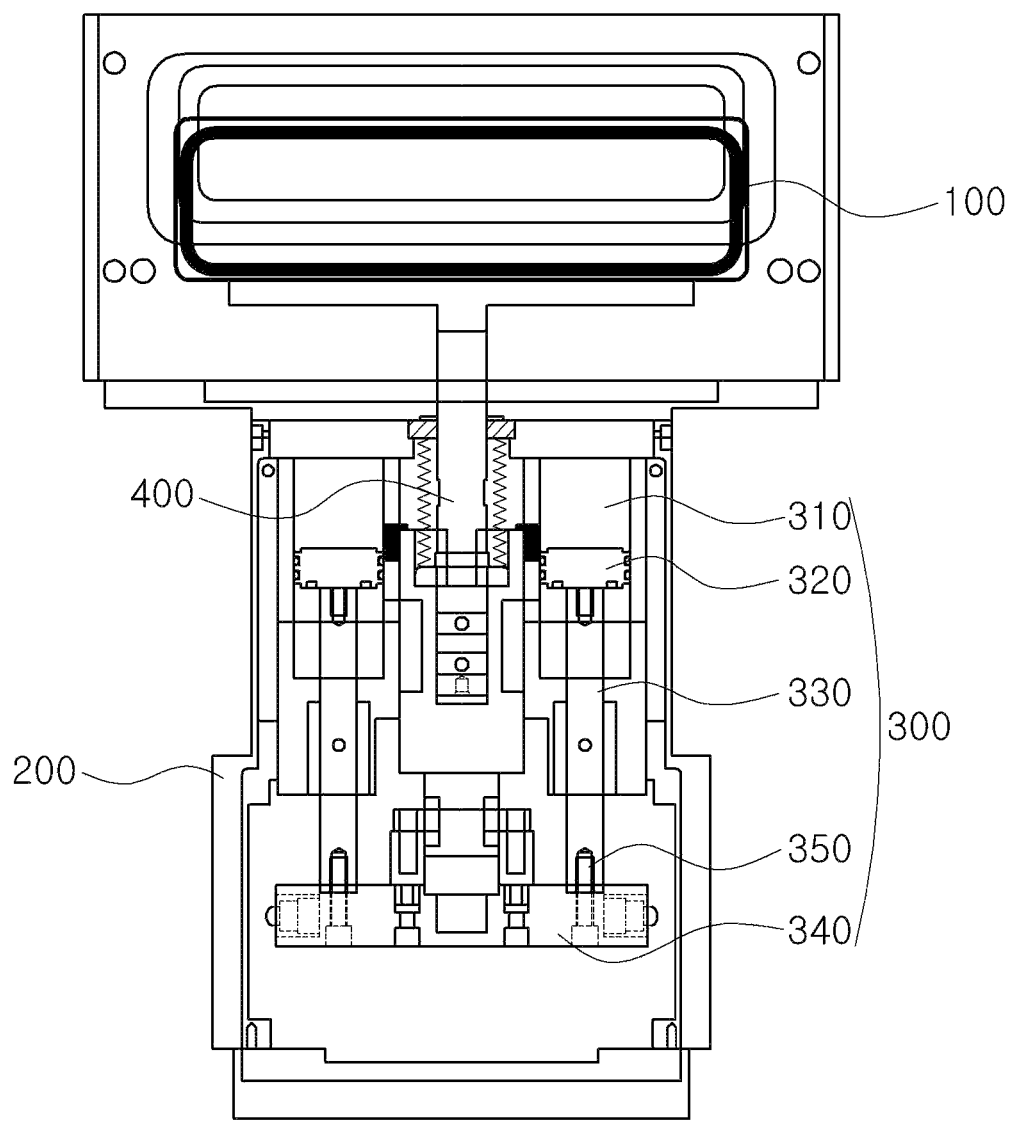
FIG. 1 is a cross sectional view illustrating a construction of a conventional slit valve.
Figure 2:
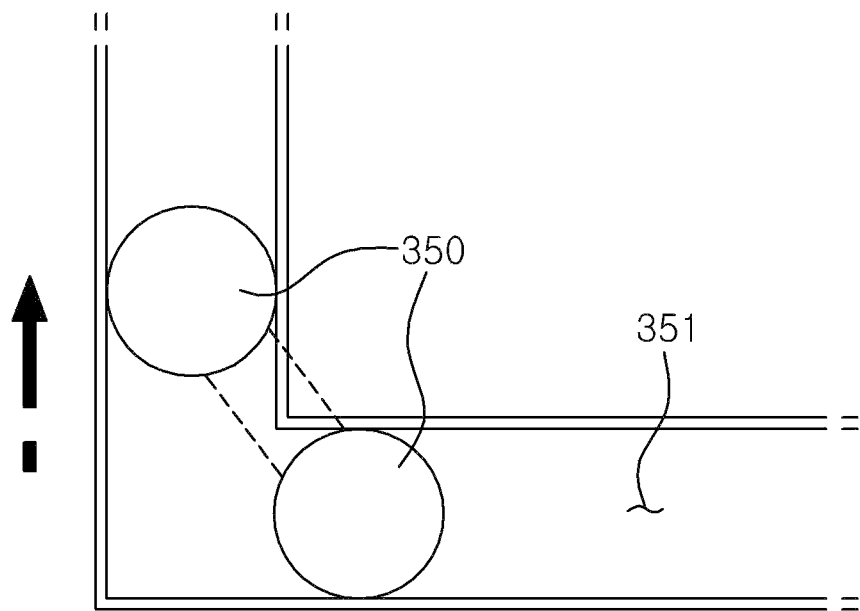
FIG. 2 is a view of a motion of a link of a conventional slit valve.

The embodiments of the present invention will be described with reference to the accompanying drawings. The same reference numerals in each drawing mean the same elements. The descriptions of the related conventional functions or construction will be omitted to avoid confusion.

Figure 3:
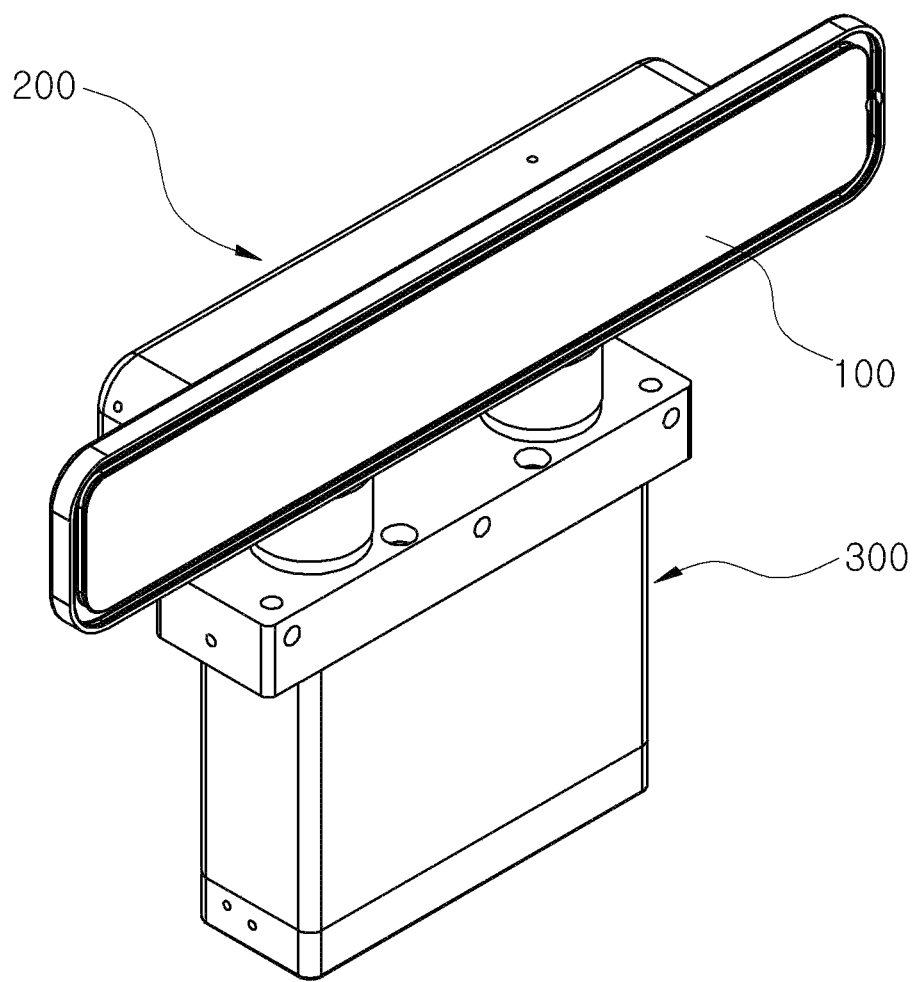
FIG. 3 is a front perspective view illustrating a door valve according to a preferred embodiment of the present invention.
Figure 4:
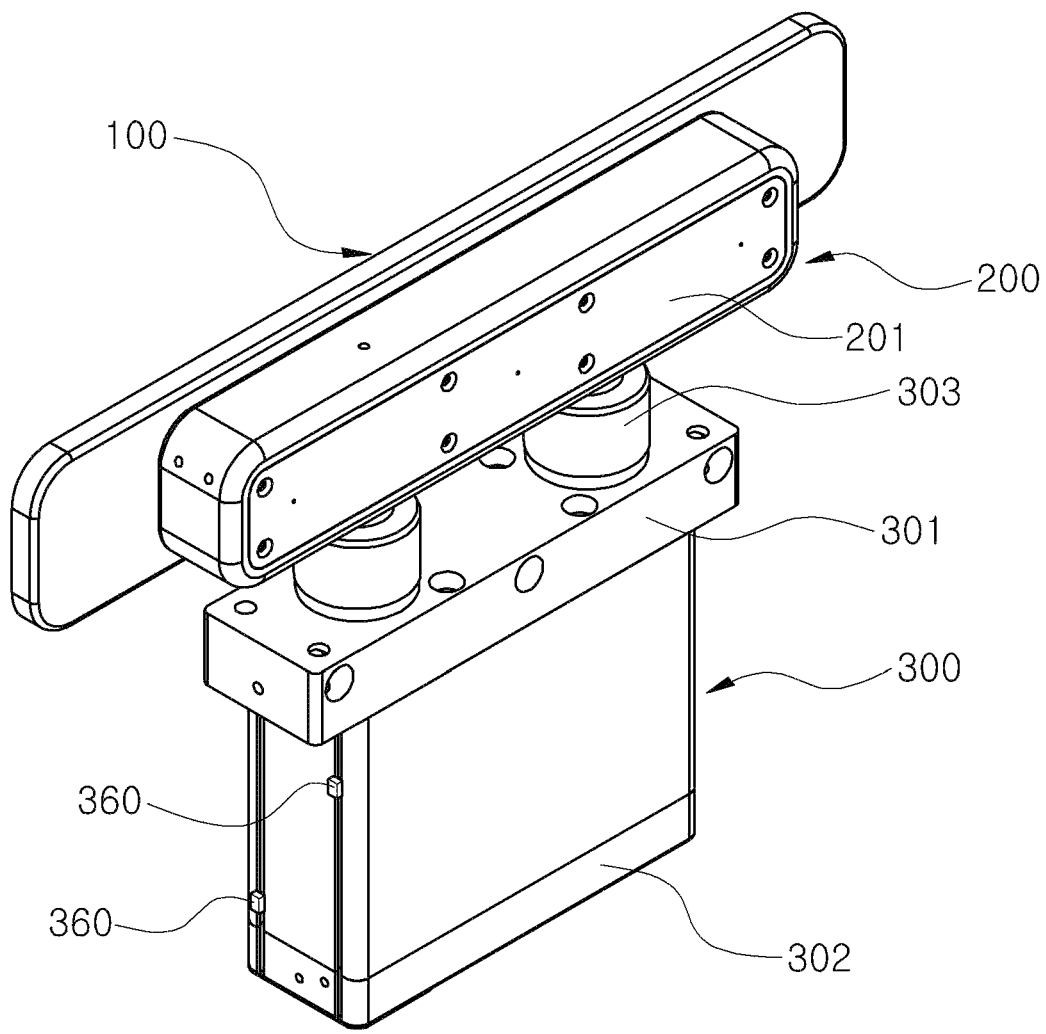
FIG. 4 is a rear perspective view illustrating a door valve according to a preferred embodiment of the present invention.
Figure 5:
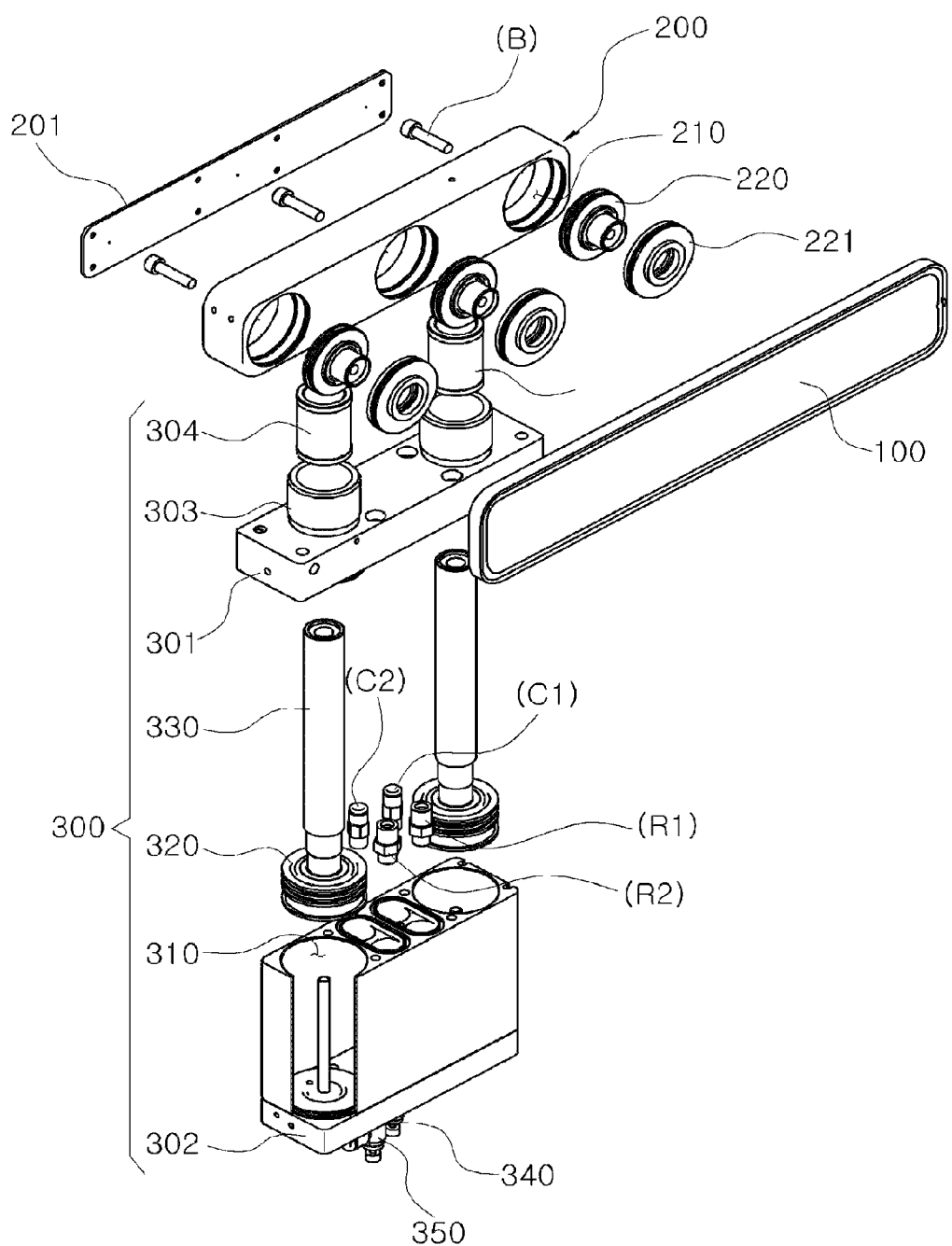
FIG. 5 is a disassembled perspective view of FIG. 3.
Figure 6:
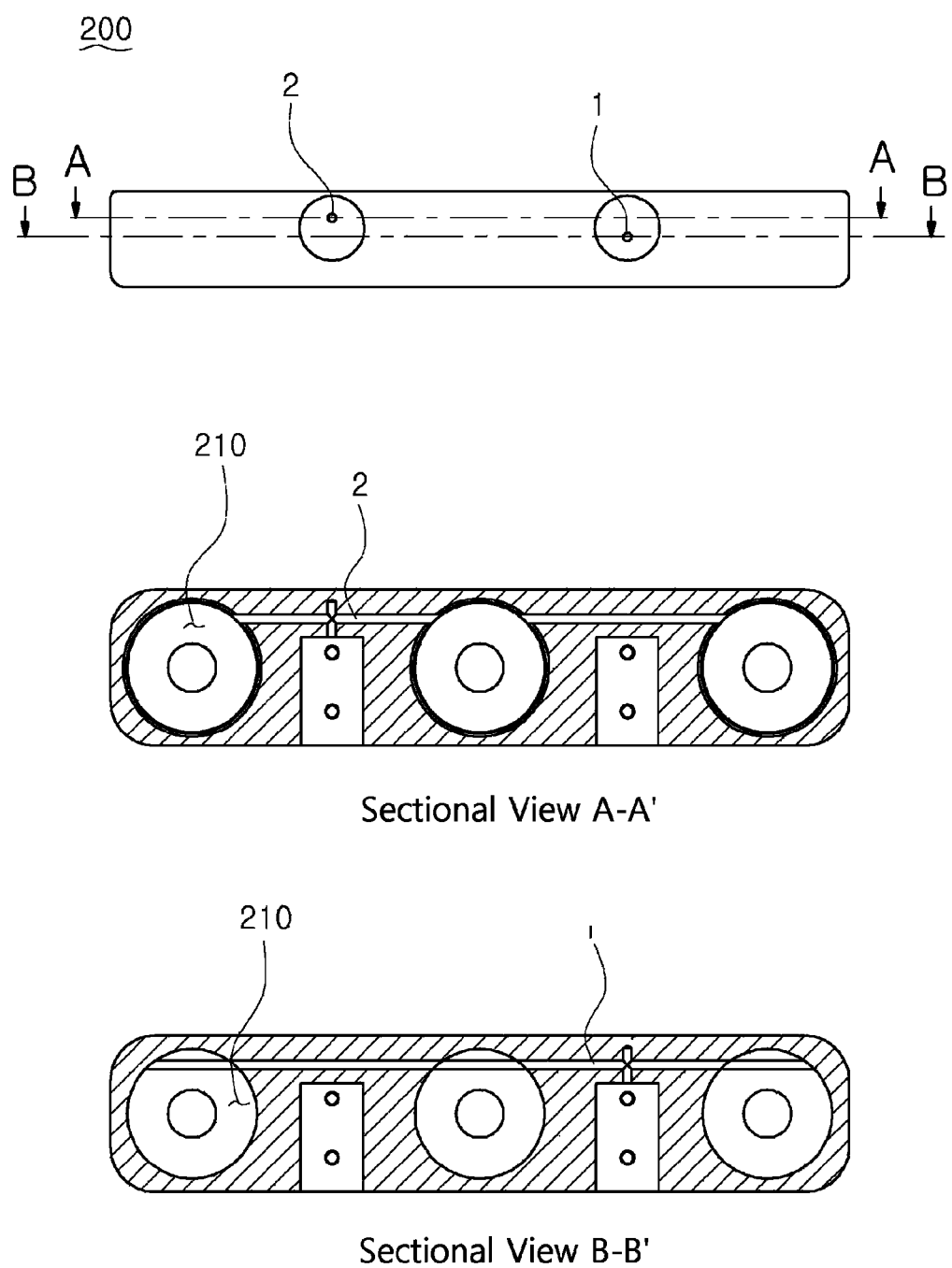
FIG. 6 is a front view and a cross sectional view taken along lines A-A and B-B of a forward and backward actuator unit of a door valve according to a preferred embodiment of the present invention.
Figure 7:
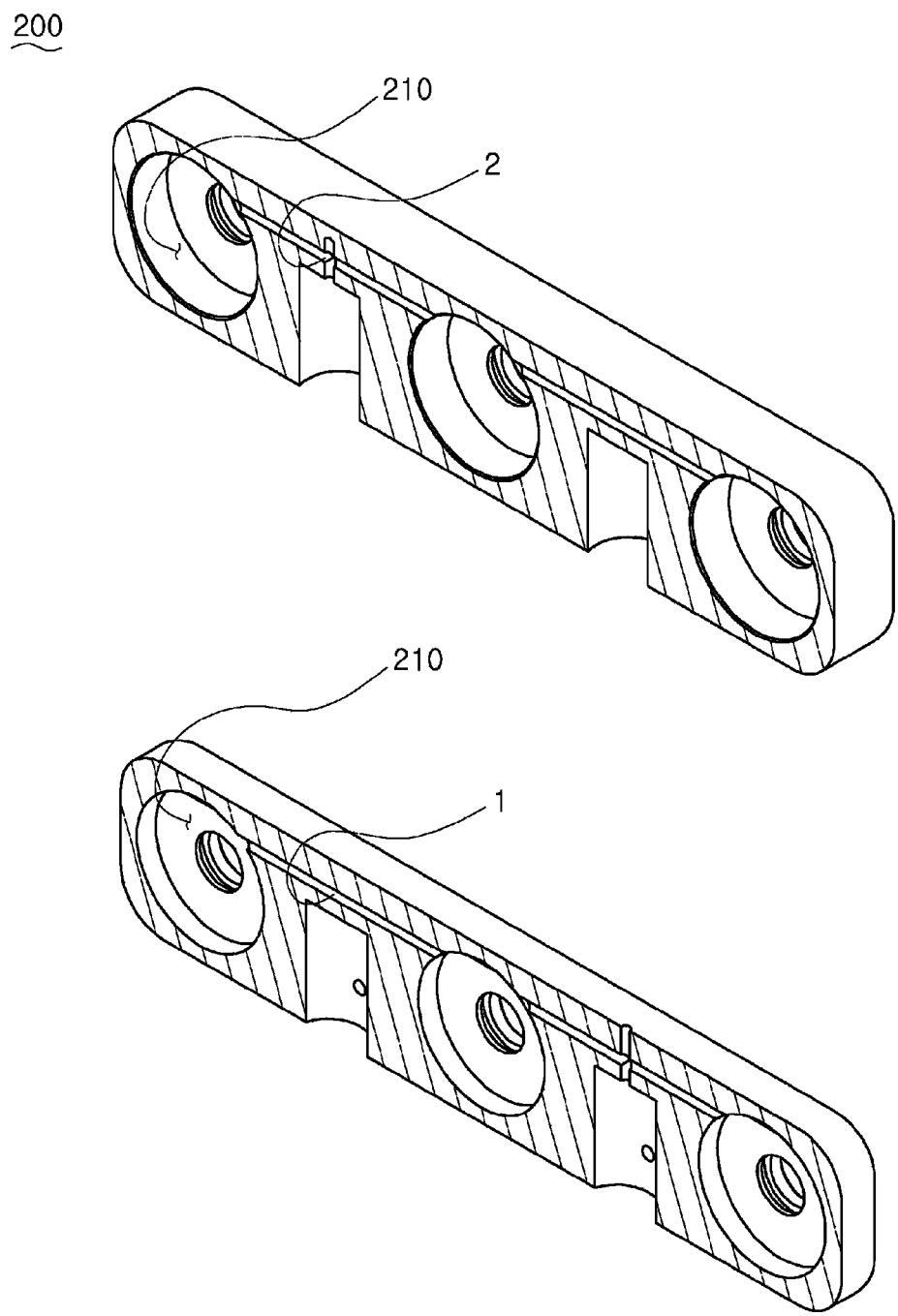
FIG. 7 is a cross sectional perspective view taken along line A-A and a cross sectional perspective view taken along line B-B of FIG. 6.
Figure 8:
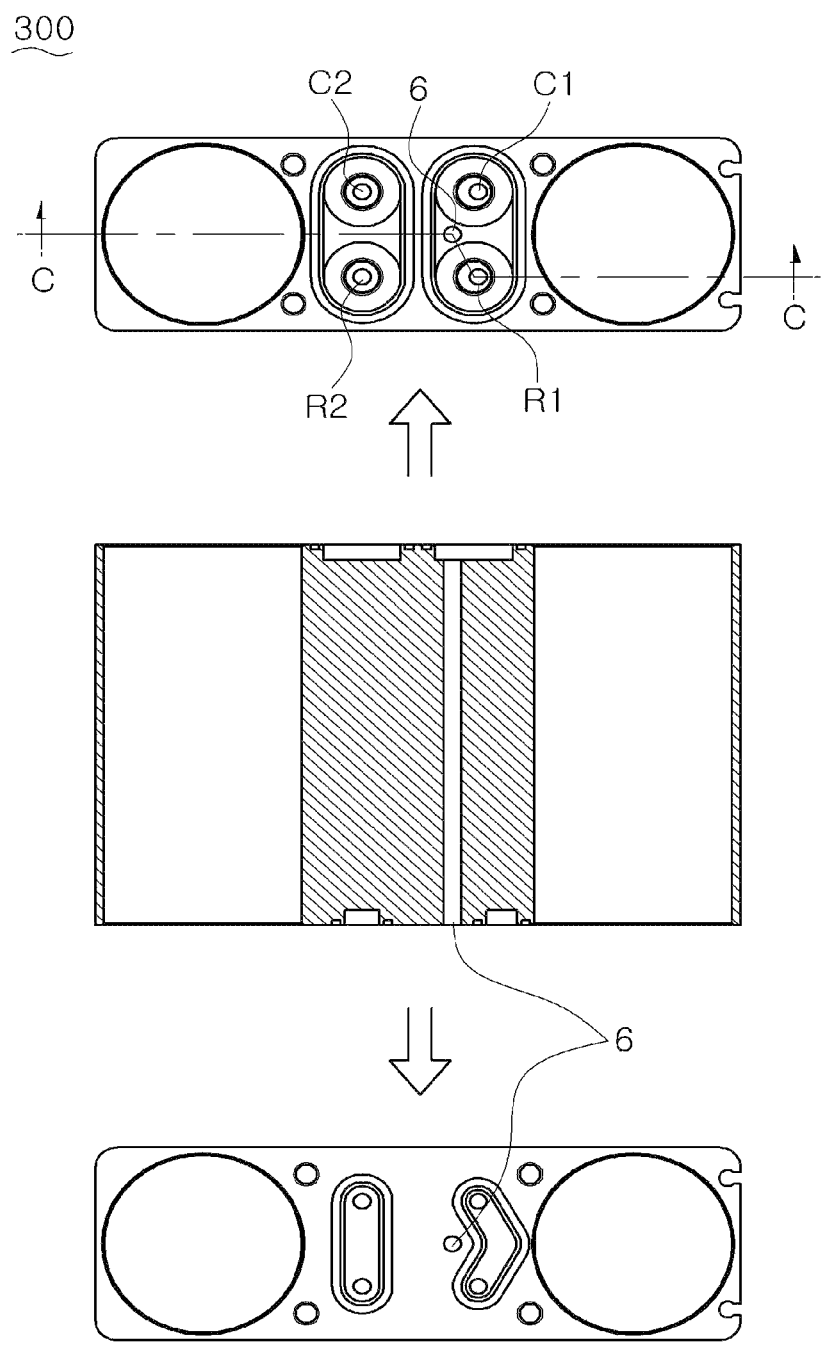
FIG. 8 is a cross sectional, plane and bottom view illustrating an up and down operating actuator unit of a door valve according to a preferred embodiment of the present invention.
Figure 9:
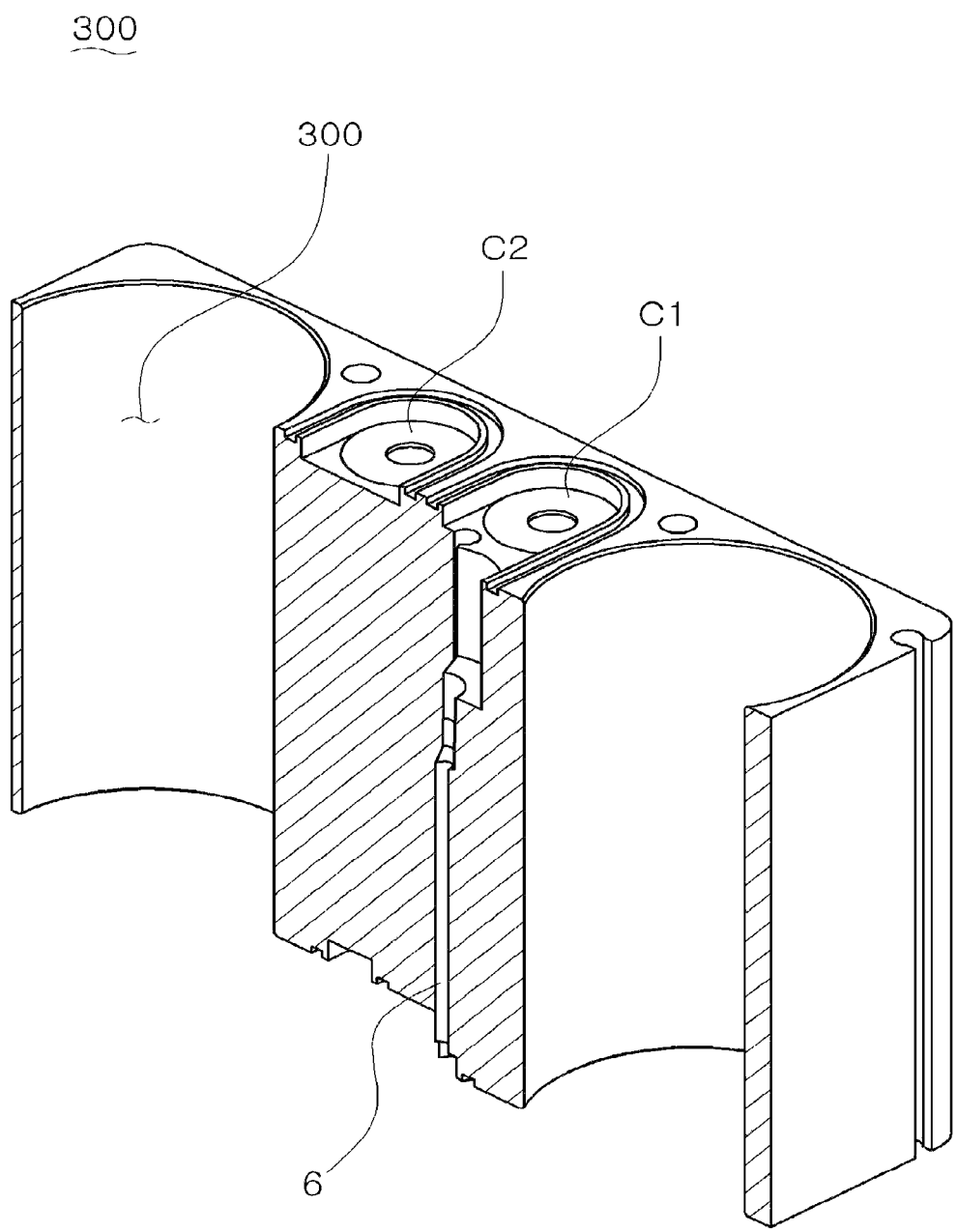
FIG. 9 is a cross sectional perspective view taken along line C-C of FIG. 8.

FIG. 3 is a front perspective view illustrating a door valve according to a preferred embodiment of the present invention. FIG. 4 is a rear perspective view illustrating a door valve according to a preferred embodiment of the present invention. FIG. 5 is a disassembled perspective view of FIG. 3. FIG. 6 is a front view and a cross sectional view taken along lines A-A and B-B of a forward and backward actuator unit of a door valve according to a preferred embodiment of the present invention. FIG. 7 is a cross sectional perspective view taken along line A-A and a cross sectional perspective view taken along line B-B of FIG. 6. FIG. 8 is a cross sectional, plane and bottom view illustrating an up and down operating actuator unit of a door valve according to a preferred embodiment of the present invention. FIG. 9 is a cross sectional perspective view taken along line C-C of FIG. 8.

The door valve according to a preferred embodiment of the present invention comprises an opening and closing member 100, a forward and backward actuator unit 200 and an up and down operating actuator unit 300 and further comprises a first flow path 1, a second flow path 2, a third flow path 3, a fourth flow path 4, a fifth flow path 5, a sixth flow path 6, a seventh flow path 7, a first cylinder 210, a first piston 230, a second cylinder 310, a second piston 320, a magnet member 321, an upper and lower shaft 330, a first compression air inlet through hole 340, a second compression inlet through hole 350, a magnet type sensor 360, a contact type sensor 361 and a connection member.

A compression air flows via the first through seventh flow paths, which will be described later, so the forward and backward actuator unit 200 and the up and down operating actuator unit 300 are driven by means of the compression air flowing via the first to seventh flow paths.

The opening and closing member 100 is installed at a front side of the forward and backward actuator unit 200 and moves forward or backward by the compression air inputted into the forward and backward actuator unit 200, thus opening and closing the semiconductor wafer movement path (not shown). It is preferred that an O-ring is installed at a surface coming contact with the semiconductor wafer movement path.

As shown in FIGS. 6 and 7, the forward and backward actuator unit 200 comprises a first cylinder 210, a first piston 220 installed in the interior of the first cylinder 210 and a connection member B engaged to the back of the opening and closing member 100 via the center of the first piston 220. The connection member B serves to transfer the forward and backward motions of the first piston 220 to the opening and closing member.

Figure 16:
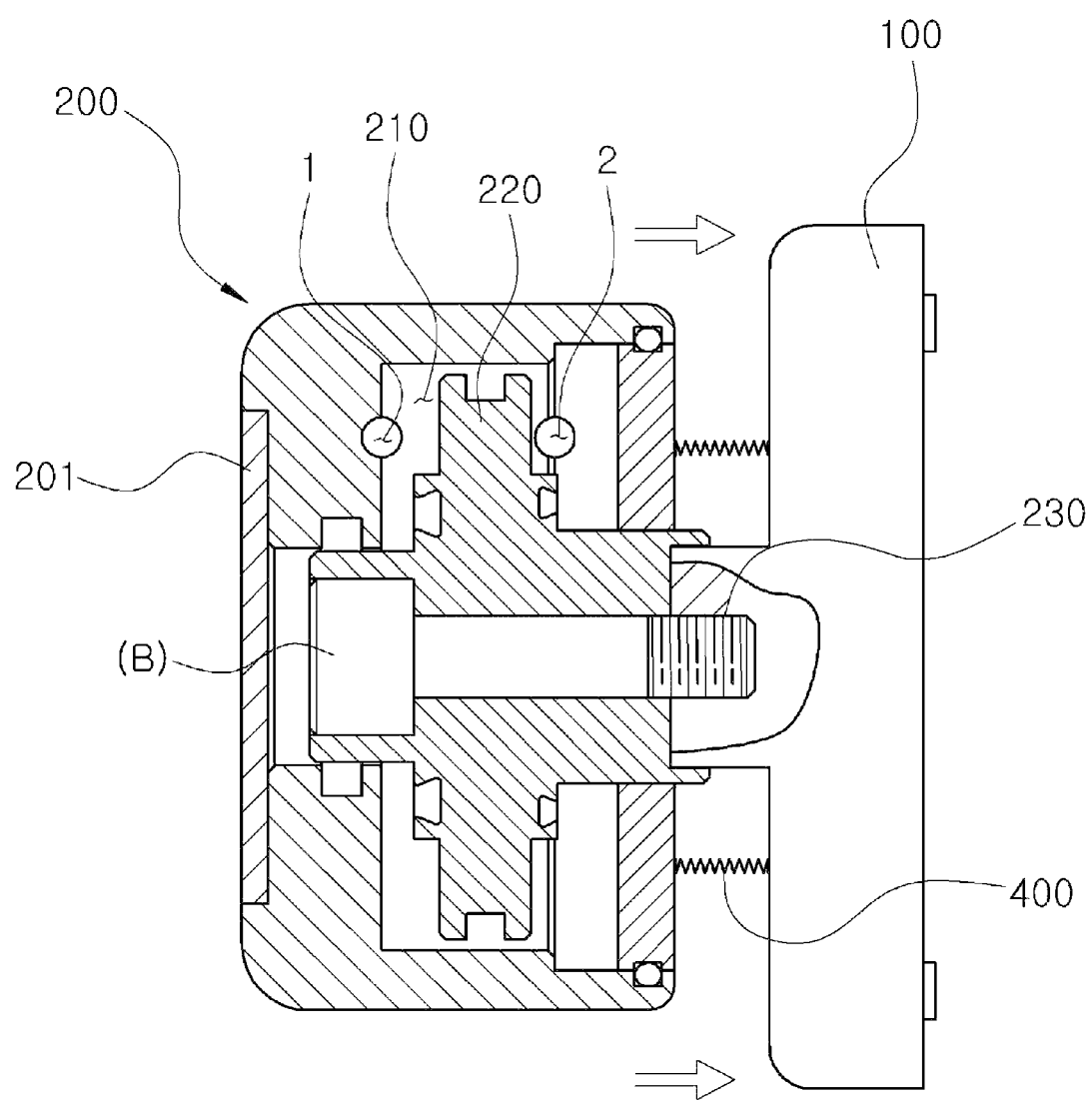
FIGS. 16 and 17 are cross sectional view illustrating a forward and backward motion of a forward and backward actuator unit of the present invention.
Figure 17:
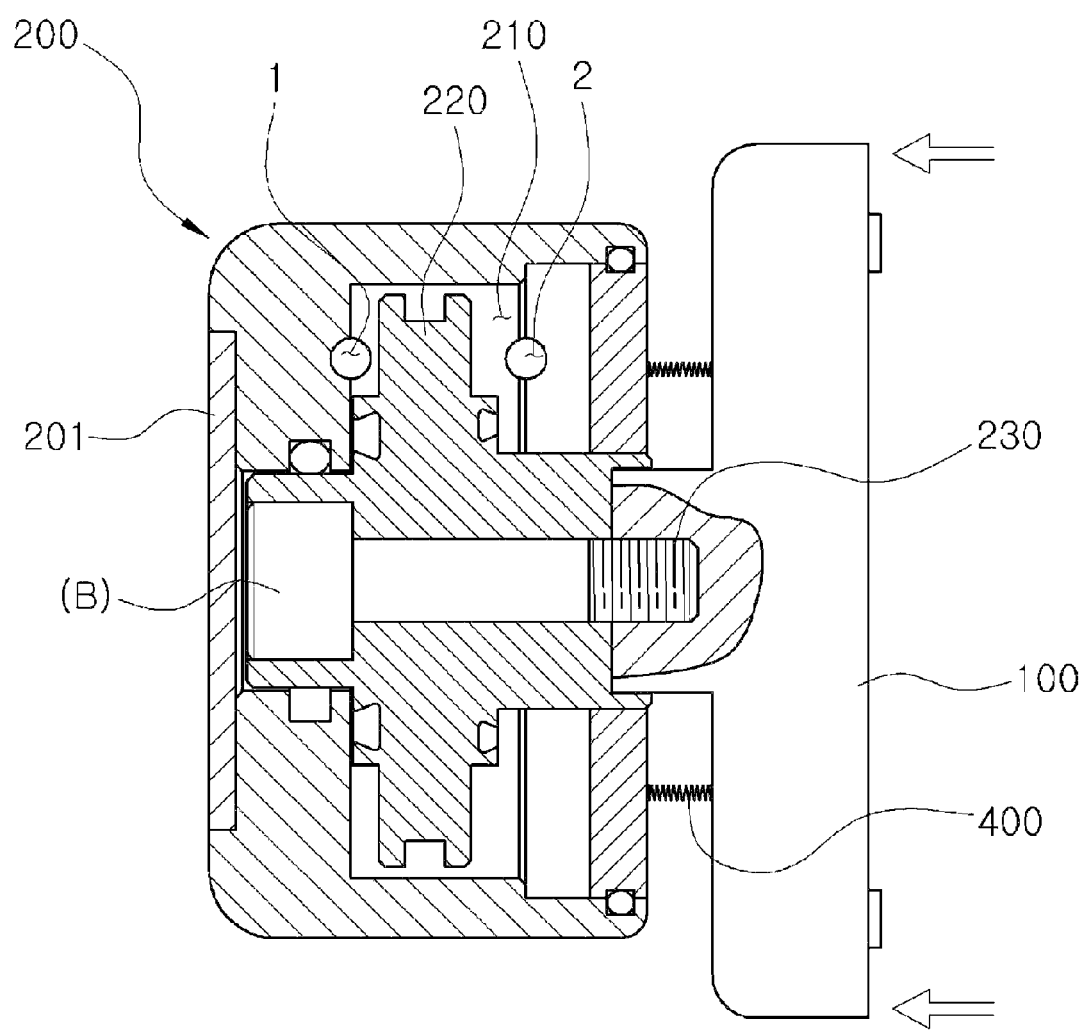

As shown in FIGS. 16 and 17, the first cylinder 210 has a first flow path 1 at a rear side, and a second flow path 2 at a front side which is defined as being closer to the opening and closing member 100.

The first piston 220 is installed in the interior of the first cylinder 210, and as shown in FIG. 5, it is preferred that the cover 221 overing the front side of the first cylinder 210 is installed so that the first piston 220 can operate only in the interior of the first cylinder 210.

The first piston 220 moves forward and backward and it moves forward when the compression air is inputted into the first flow path 1, and it moves backward when the compression air is inputted into the second flow path 2.

The first piston 220 serves to connect the first piston 220 and the opening and closing member 100 as the connection member B passes through the same. It is preferred that the connection member B is made from a bolt or an engaging pin.

The opening and closing member 100 engaged to the first piston 220 via the connection member B serves to open and close the semiconductor wafer movement path as it operated depending on the forward and backward motions of the first piston 220.

The up and down operating actuator unit 300 comprises a second cylinder 310, a second piston 320, an upper and lower shaft 330, a first compression air inlet through hole 340 and a second compression air inlet through hole 350.

As shown in FIGS. 14 and 15 and 18 to 20, the second cylinder 310 is installed in the interior of the up and down operating actuator unit 300, and the second piston 320 is installed in the interior of the second cylinder 310, and the upper and lower shaft 330 is installed at the center of the second piston 320.

The second piston 320 is installed in the interior of the second cylinder 310 and operates upward and downward by means of the compression air, and the second piston 320 operates in the upward and downward directions by the compression air inputted into the first compression air inlet through hole 340 and the second compression air inlet through hole 350.

The upper and lower shaft 330 is configured with its one side connected with the center of the second piston 320, the other side connected with the forward and backward actuator unit 200. So the upper and lower shaft 330 transfers the ascending and descending motions of the second piston to the forward and backward actuator unit 200, thus rising the opening and closing member 100 to the height matching with the semiconductor wafer movement path or lowering to the initial state.

Figure 14:
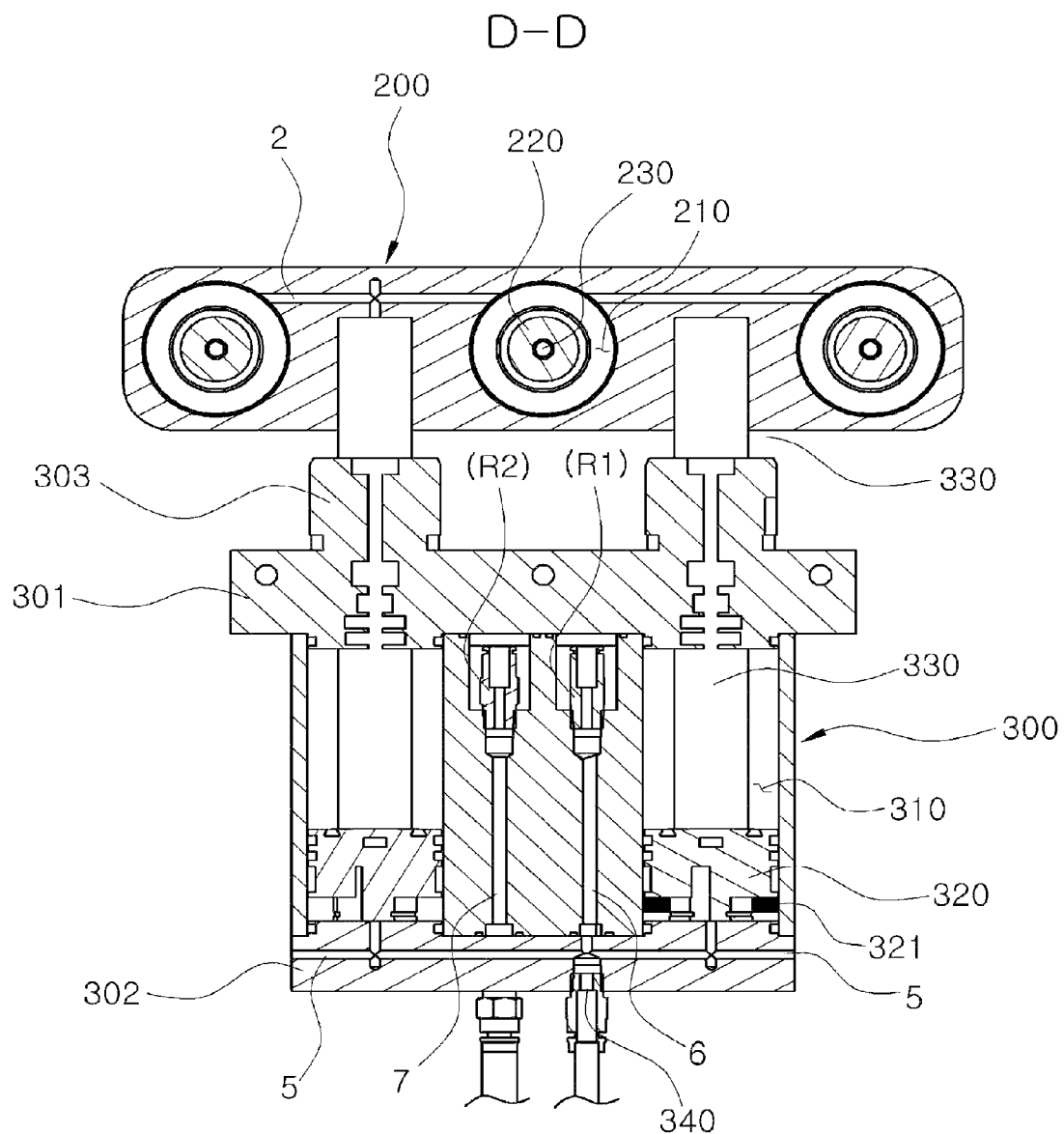
FIG. 14 is a cross sectional view taken along line D-D of FIG. 10.

As shown in FIG. 14, the first compression air inlet through hole 340 is a member into which the compression air is inputted when the semiconductor wafer movement path of the opening and closing member 100 is closed. The compression air inputted into the first compression air inlet through hole 340 is supplied to the flow path involved in the forward motion of the opening and closing member 100 among the flow paths which will be described later. The detailed descriptions will be provided later.

Figure 15:
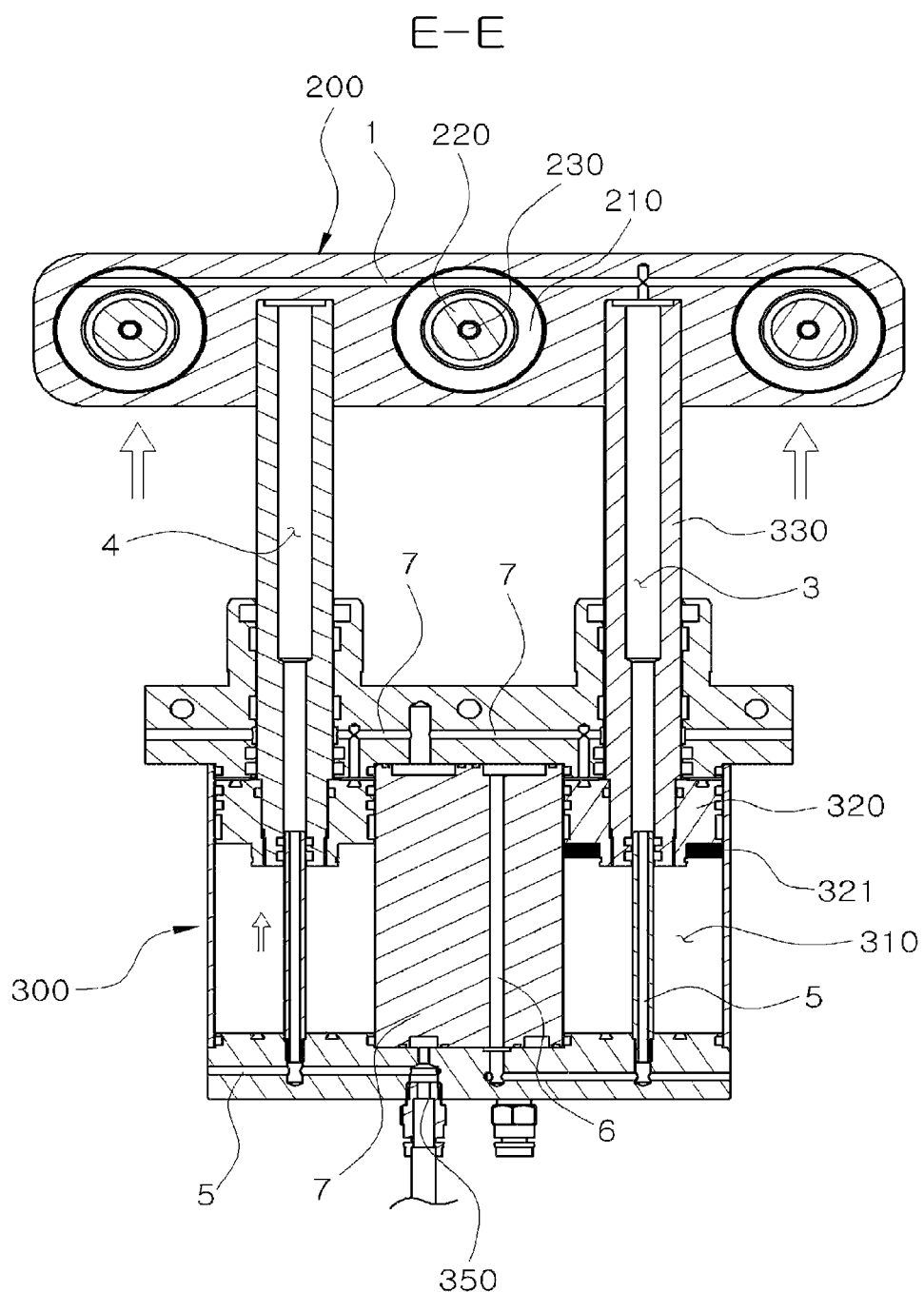
FIG. 15 is a cross sectional view taken along line E-E of FIG. 11.

As shown in FIG. 15, the second compression air inlet through hole 350 serves to operate reversely to the first compression air inlet through hole 340, namely, the compression air is inputted into the same when the semiconductor wafer movement path of the opening and closing member 100 is opened.

The compression air inputted into the second compression air inlet through hole 351 is supplied to the flow path involved in the backward motion of the opening and closing member 100 among the flow paths. The detailed description will be provided later The operations of the door valve according to a preferred embodiment of the present invention will be described with reference to FIGS. 10 to 20.

Figure 18:
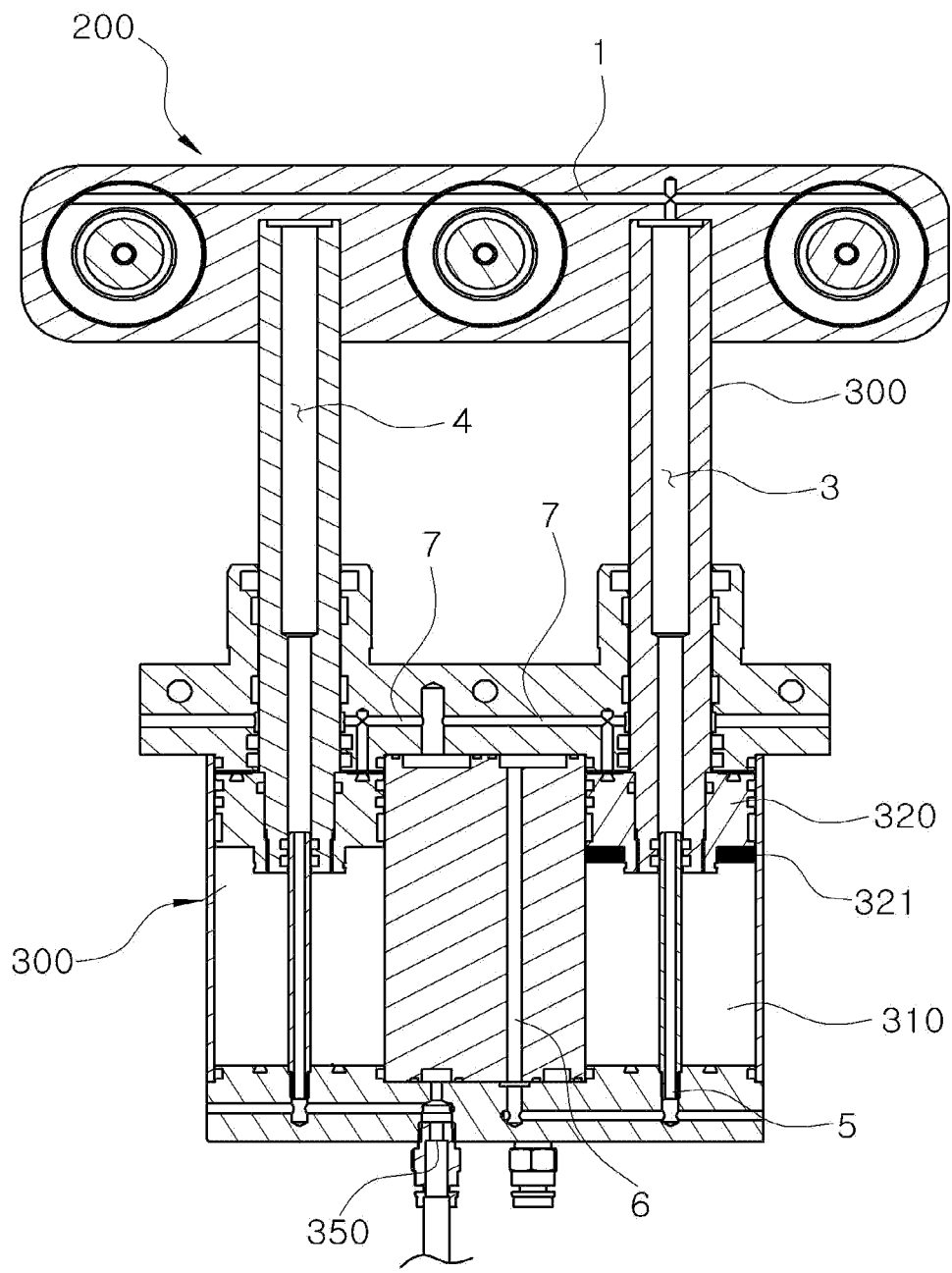
FIGS. 18 to 20 are cross sectional views illustrating an operation that a semiconductor wafer movement path is opened and at the same time is recovered to an initial state according to the present invention.
Figure 19:
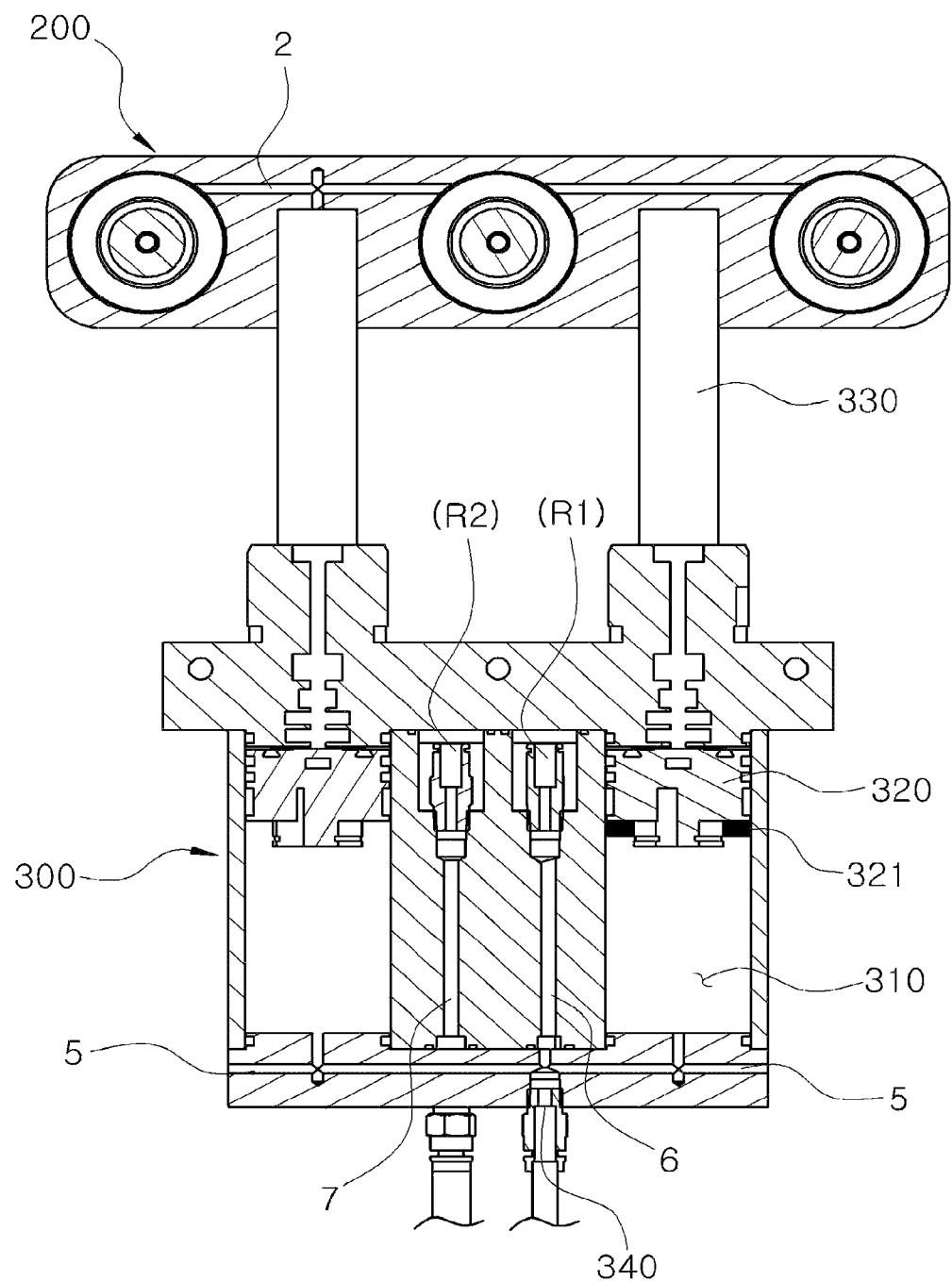
Figure 20:
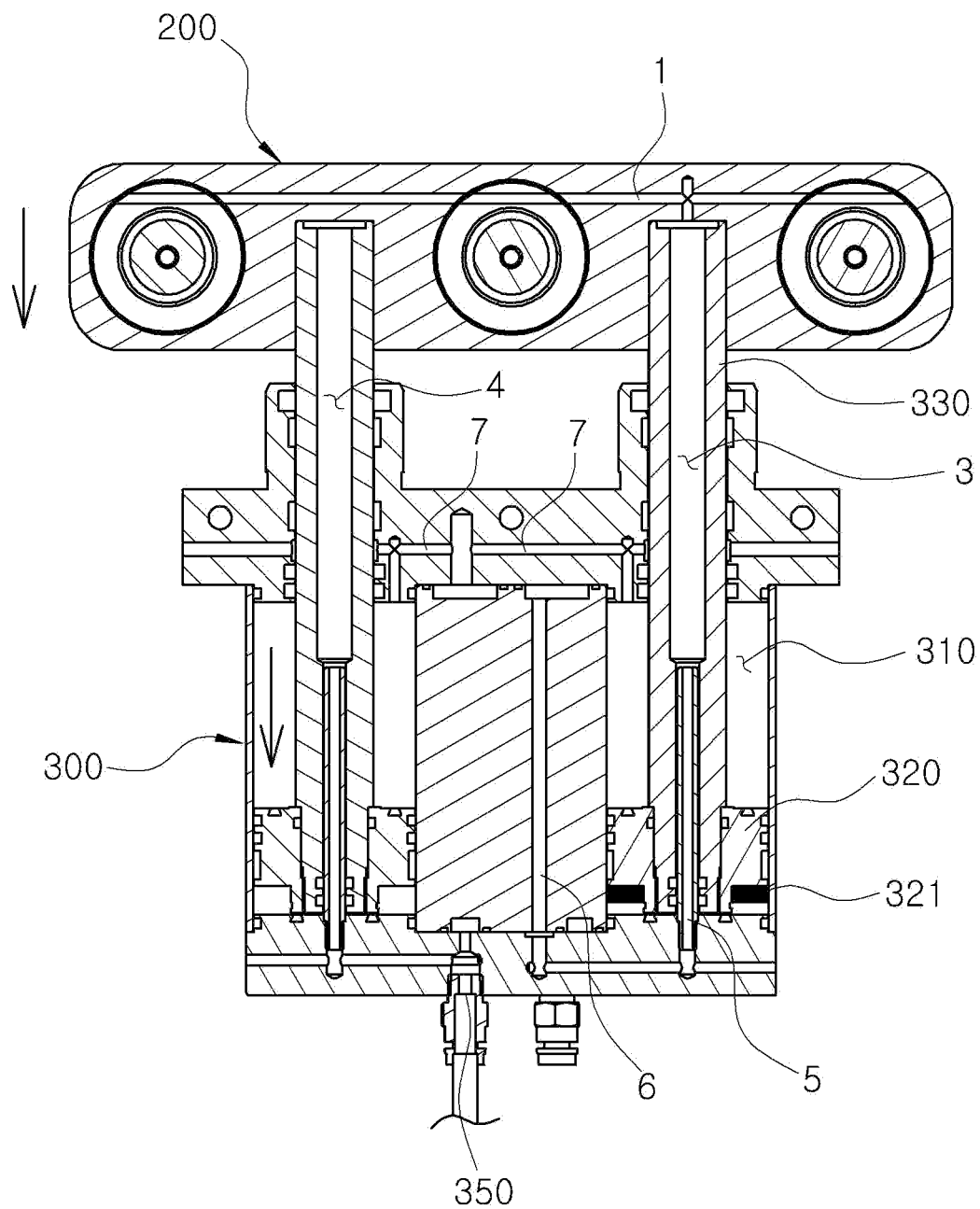

FIGS. 10 to 13 are side views illustrating an operation of the present invention. FIG. 14 is a cross sectional view taken along line D-D of FIG. 10. FIG. 15 is a cross sectional view taken along line E-E of FIG. 11. FIGS. 16 and 17 are cross sectional view illustrating a forward and backward motion of a forward and backward actuator unit of the present invention. FIGS. 18 to 20 are cross sectional views illustrating an operation that a semiconductor wafer movement path is opened and at the same time is recovered to an initial state according to the present invention.

Figure 10:
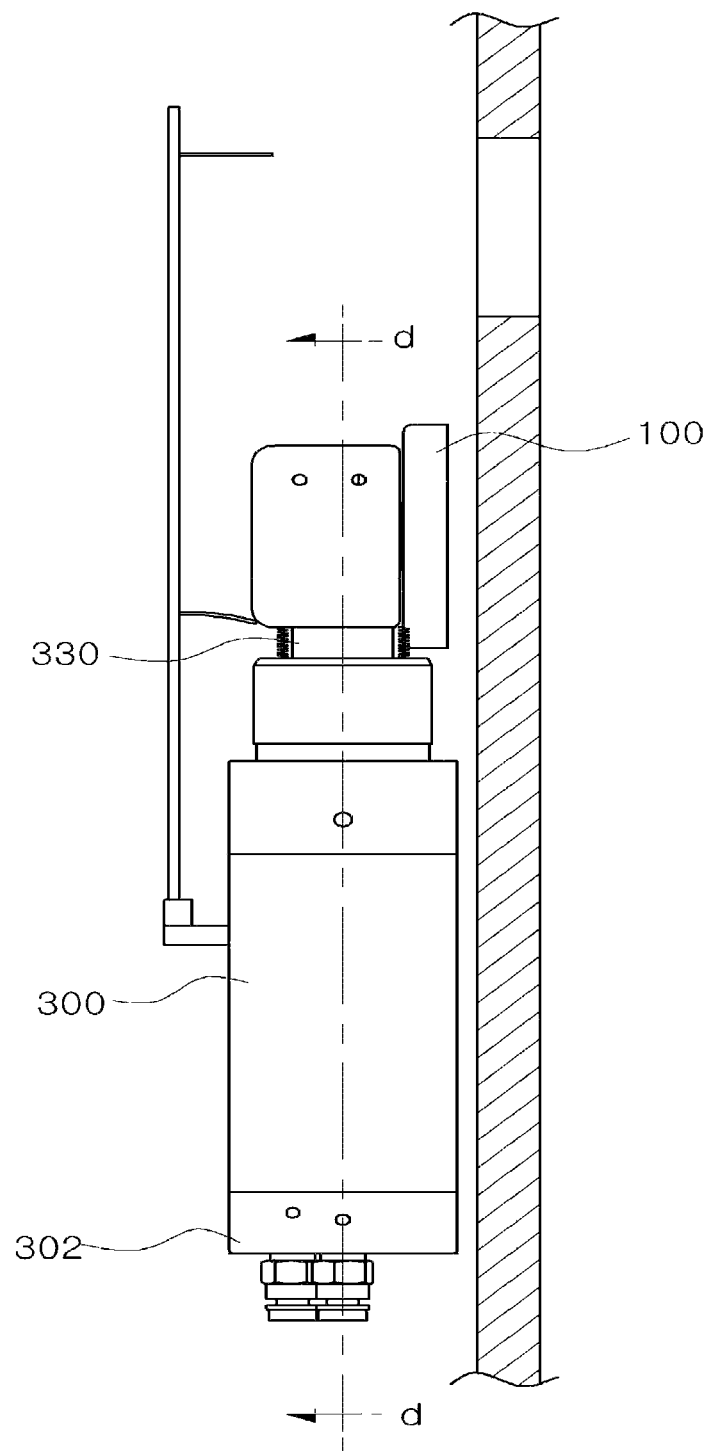
FIGS. 10 to 13 are side views illustrating an operation of the present invention.

The operation of the flow of the compression air supplied to the first to seventh flow paths will be described. The term "the initial state" represents a state that the opening and closing member 100 is fully moved downward as shown in FIGS. 10, 14 and 20.

The first flow path 1 is formed at a lower side of the first cylinder 210, and the second flow path 2 is formed at an upper side of the first cylinder 210, and the third flow path 3 is formed in upward and down directions in the interior of the upper and lower shaft of one of the two upper and lower shafts 330, and the fourth flow path 4 is formed in upward and downward directions in the interior of the upper and lower shaft of the other one of the two upper and lower shafts 330.

The fifth flow path 5 communicates with the first compression air inlet through hole 340 and the sixth flow path 6, and at the sixth flow path 6 are installed a relief valve R1 which opens for a certain pressure, and a check valve C1. The seventh flow path 7 communicates with the second compression air inlet through hole 350, and at the seventh flow path 7 are installed a relief valve R2 and a check valve C1.

The operation of closing and opening the semiconductor wafer movement path using the opening and closing member 100 will be described.

At the initial state, the compression air is inputted into the first compression air inlet through hole 340. As the compression air starts to input into the first compression air inlet through hole 340, the compression air is concurrently into both the fifth flow path 5 and the sixth flow path 6 which both communicate with the first compression air inlet through hole 340, namely, the states of FIGS. 10 and 14 change to the states of FIGS. 11 and 15.

At this time, the fifth flow path 5 and the sixth flow path 6 come to have the same pressure. The compression air is first inputted into the fifth flow path 5 since the relief R1, which selectively opens when a certain pressure level occurs, is installed at the sixth flow path 6.

The relief valve R1 is also installed at the seventh flow path 7. It is preferred that the relief valves R1 and R2 open after they withstand the primary pressure which occurs as the compression air inputted into the first compression inlet through hole 340 and the second compression air inlet through hole 350 come to input into the flow paths. It is preferred to properly determine a resilience coefficient of the spring installed at the relief valve R1 when designing the present invention.

The compression air inputted into the fifth flow path 5 is inputted into the lower side of the second cylinder 310 communicating with the fifth flow path 5. When the compression air is inputted into the interior of the second cylinder 310, the second piston 320 moves upward, and the upper and lower shaft 300 installed at the center of the second piston 320 moves upward as well.

At this time, the relief valve R1 installed at the sixth flow path 6 should keep closed.

Figure 11:
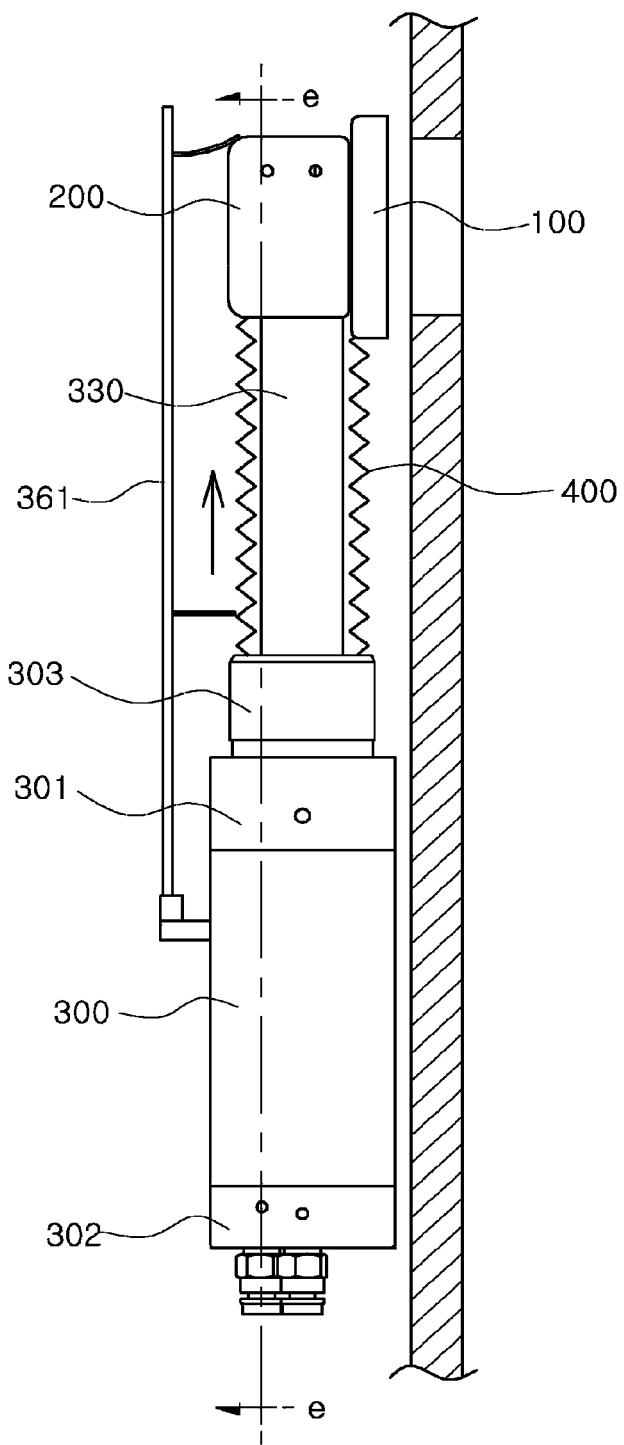

As shown in FIGS. 11 and 15, when the second piston 320 continues to move and reaches the top dead point, the compression air inputted into the first compression air inlet through hole 340 gathers at the sixth flow path 6, and as the compression air is continuously supplied, the relief valve R1 starts to open gradually.

Figure 12:
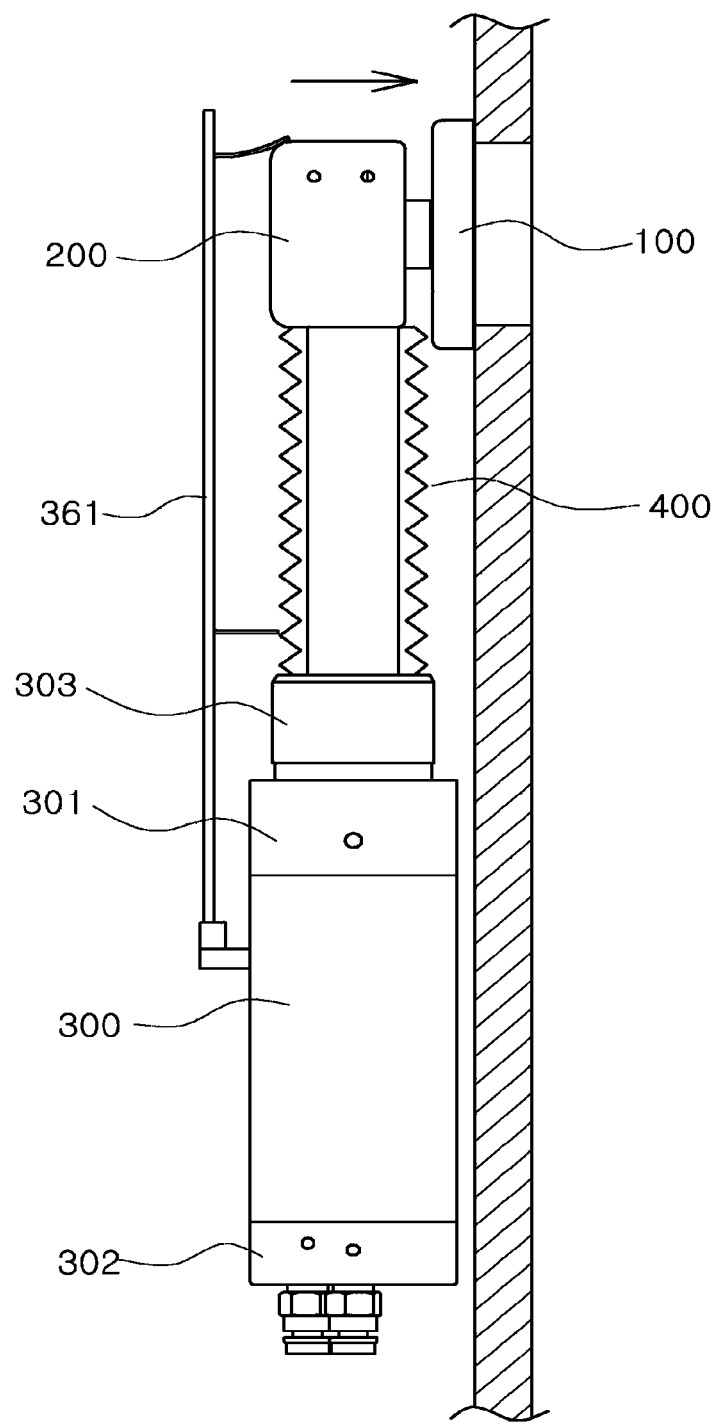
Figure 13:
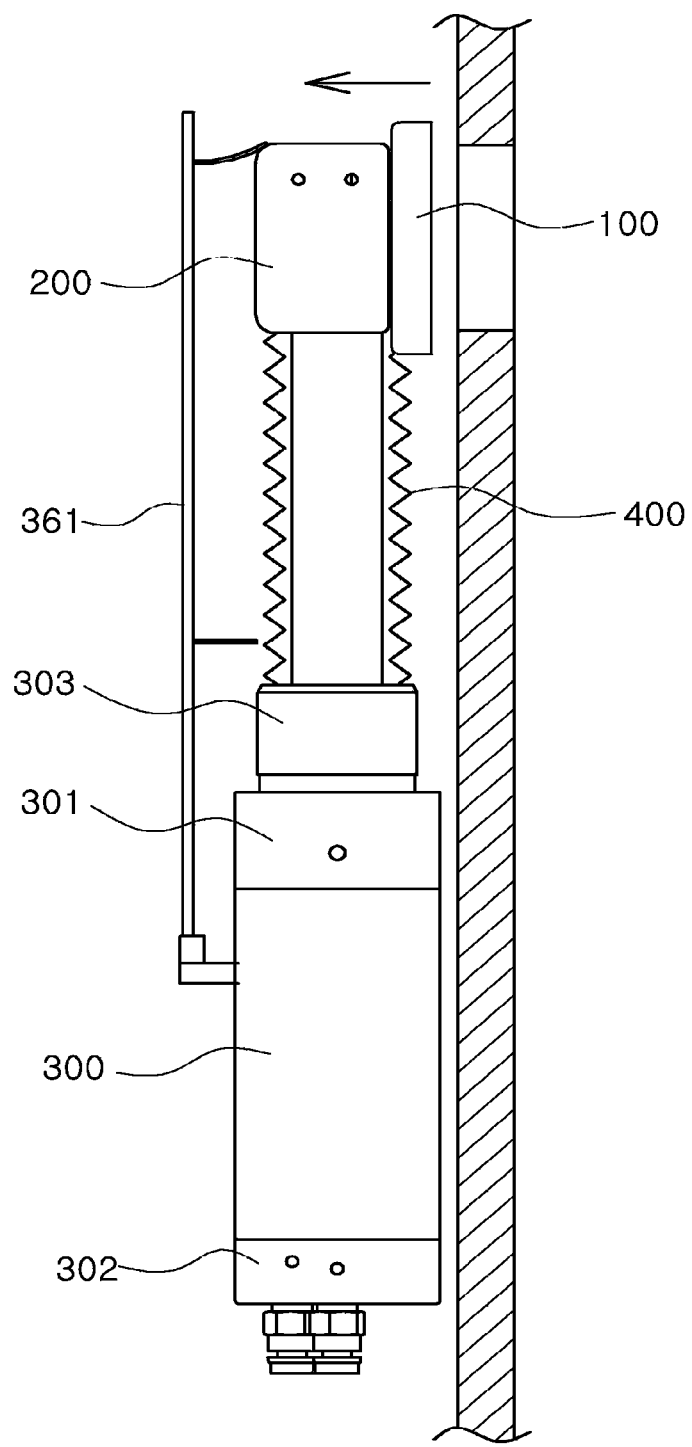

When the relief valve R1 starts to open gradually, the compression air is inputted into the first flow path 1 via the third flow path 3 formed in the interior of the upper and lower shaft of one side, and the first piston 220 gradually moves by means of the compression air inputted into the first flow path 1 as shown in FIGS. 12 and 16.

As the opening and closing member 100 connected with the first piston 220 via the connection member B starts to move, the semiconductor wafer movement path is closed, the state of which is called a sealed state.

Next, the operation that the state that the semiconductor wafer movement path is sealed using the opening and closing member, changes to the initial state will be described.

In order to move the semiconductor wafer in the sealed state, the opening and closing member 100 should open the semiconductor wafer movement path. In this case, the compression air is inputted into the second compression air inlet through hole 350.

The compression air inputted into the second compression air inlet though hole 350 is concurrently inputted into both the fourth flow path 4 and the seventh flow path 7 formed in the interior of the upper and lower shaft. Since the relief valve R2 is installed at the seventh flow path 7, the compression air is first inputted into the fourth flow path. The compression air inputted into the fourth flow path 4 is inputted into the second flow path 2 communicating with the fourth flow path 4.

When the compression air is inputted into the second flow path 2, as shown in FIG. 7, the first piston 220 moves backward, and the connection member B connected with the first piston 220 moves backward as well. So, the opening and closing member 100 connected with the connection member B moves backward.

When the opening and closing member 100 moves backward, the semiconductor wafer movement path, which keeps the sealed state, is opened, and as shown in FIG. 17, the first piston 220 moves backward to the bottom dead point.

When the first piston 220 moves to the bottom dead point, the compression air inputted into the second compression air inlet through hole 350 gathers at the seventh flow path 7, and when pressure exceeding a certain level occurs, the relief valve R2 starts to open gradually, and the compression air, as shown in FIG. 20, is inputted into the upper side of the second cylinder 310 via the seventh flow path 7.

When the compression air is inputted into the upper side of the second cylinder 310, the second cylinder 310, which is positioned at the top dead point, moves downward toward the bottom dead point, thus changing to the initial state.

When the compression air is inputted into the second compression air inlet through hole 350, the compression air in the interior is discharged to the outside via the first compression air inlet through hole 340 so that the forward and backward shaft 230 moves backward and the upper and lower shaft 330 moves downward, the state of which is called an open state.

It is preferred that the magnet member 321 is installed at the second piston 320 for externally checking out the position of the top dead point or the bottom dead point of the second piston 320. As shown in FIG. 4, the sensor 360 detecting the magnet ember 321 is provided at the up and down operating actuator unit 300 as shown in FIG. 4.

In addition, it is preferred that the upper cover 301 is detachable from the upper side of the up and down operating actuator unit 300 and the lower cover 302 is detachable from the lower side of the same, and it is preferred that a rubber sealing member (O-ring) (not shown) is installed at each engaging portion so that the interior of the second cylinder 310 maintains a sealed state.

As shown in FIG. 5, the lower cover 302 has a straw shaped tube which communicates with the interiors of the third flow path 3 and the fourth flow path 4 of the upper and lower shaft in such a way that the upper and lower shaft 330 can be stably guided when moving in the upward and downward directions of the upper and lower shaft 330.

It is preferred that the above tube is formed to have a certain length longer than the distance that the upper and lower shaft 330 moves in upward and downward direction and is formed to communicate with the third flow path 3 and the fourth flow path 4 even when the second piston 320 moves to the top dead point.

As shown in FIG. 5, the upper cover 301 is preferably characterized in that the guide part 303 is upwardly projected for accurately guiding the upward and downward motions of the upper and lower shaft 330, and a rubber sealing member (O-ring) is installed in the interior of the guide part 303 for the purpose of sealing the second cylinder 310.

As shown in FIG. 5, in the interior of the guide part 303 is preferably installed a bushing 304. The bushing 304 serves to attenuate the stress generating due to the contact between the upper and lower shaft 330 and the guide part 303 by means of the eccentricity occurring when the opening and closing member 100 moves forward and backward and to seal the second cylinder 310.

Since the bushing 304 is installed at a portion where stress occurs, it is preferred that it is made from a certain material with a relatively low hardness such as copper or plastic.

It is preferred that a bellows 400 is installed between the upper side of the guide part 30 and the forward and backward actuator unit 200 and between the opening member 400 and the forward and backward actuator unit 200. The bellows 400 serves to attenuate the vibration and noise occurring during the operation of the present invention and serves to protect the key elements of the present invention from the powder coming from the semiconductor manufacture processes when installing the system of the present invention.

The check valves C1 and C2 installed at the sixth flow path 6 and the seventh flow path 7 will be described.

The check valves C1 and C2 installed at the sixth flow path 6 and the seventh flow path 7 are installed to open in one direction like the relief valves R1 and R2 and open at the time the compression air inputted into the first compression air inlet through hole 34 and the second compression air inlet through hole 350 is discharged externally. They allow the flow of fluid in the direction opposite to the relief valves R1 and R2.

In more details, the check valve C1 installed at the sixth flow path 6 opens when the compression air inputted into the first compression air inlet through hole 340 is discharged when changing from the sealed state to the open state, and the check valve C2 installed at the seventh flow path 7 opens when the compression air inputted in the second compression air inlet through hole 350 is discharged when changing from the open state to the sealed state.

The check valves C1 and C2 might be substituted with the quick exhaust valves. In case of substitution, since the time needed for exhaust is significantly decreased, it is possible to more quickly open and close the semiconductor wafer movement paths.

The quick exhaust valve is disclosed in Korean patent application number 10-2006-0023872 entitled "quick exhaust device", so its detailed description will be omitted.

As the present invention may be embodied in several forms without departing from the spirit or essential characteristics thereof, it should also be understood that the above-described examples are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

The invention claimed is:

1. A door valve, comprising:
   an opening and closing member 100 which opens and closes a semiconductor wafer movement path;
   a forward and backward actuator unit 200 which comprises:
   a first cylinder 210 which is installed at a back of the opening and closing member 100 and has a first flow path at an inner rear side, and a second flow path 2 at a front side, and a cover 221 installed at a front side;
   a first piston 220 which is installed in the interior of the first cylinder 210 and operates forward and backward by means of a compression air inputted into the first flow path and the second flow path; and
   a connection member B connecting the first piston 220 and the opening and closing member 100; and
   an up and down operating actuator unit 300 which comprises:
   a plurality of second cylinders 310 formed in the interior;
   a second piston 320 which is installed in the interior of the second cylinder 310 and moves upward and downward by means of a compression air;
   an upper and lower shaft 330 one side of which is connected with the second piston 320, and the other side of which is connected with the forward and backward actuator unit 200, the compression air flowing in the interior, the upper and lower shaft being formed of a third flow path 3 communicating with the first flow path 1, and a fourth flow path 4 communicating with the second flow path 2;
   a first compression air inlet through hole 340 formed to receive the compression air when the wafer movement path of the opening and closing member 100 is closed;
   a fifth flow path 5 which is connected from the first compression air inlet through hole 340 to the lower side of the second cylinder 310 so that the second piston 320 can move upward by means of the compression air inputted from the first compression air inlet through hole 340; and
   a sixth flow path 6 in which a relief valve R1 selectively opened when the second piston 320 reaches the top dead point by means of a compression air inputted into the fifth flow path 5 and a check valve C1 selectively opened when the second piston 320 reaches the bottom dead point are installed, the sixth flow path coming to communicate with the first compression air inlet through hole 340, the fifth flow path 5 and the first flow path 1 so that the compression air can move to the first flow path when the relief valve R1 opens.

2. A door valve according to claim 1, further comprising:
   a second compression air inlet through hole 350 which is formed to receive a compression air so that a wafer movement path can be open by means of the opening and closing member 100 and is installed at the up and down operating actuator unit 300 and communicates with the fourth flow path 4 and the second flow path 2; and
   a seventh flow path which communicates with the second compression air inlet through hole 350 and is formed of a relief valve R2 selectively opened when the first piston 220 reaches the bottom dead point by means of the compression air inputted into the second compression air inlet through hole 350, and a check valve C2 selectively opened when the first piston 220 reaches the bottom dead point and is formed for the compression air to input into the upper side of the second cylinder 320 when the relief valve R2 is open.

3. A door valve according to claim 1, further comprising:
   a magnet member 321 installed at the second piston 32; and
   a magnet type sensor 360 which is installed at the up and down operating actuator unit 300 and detects the position of the second piston 320 by detecting the magnet member 321.

4. A door valve according to claim 1, further comprising:
   a contact type sensor 361 which is installed at the up and down operating actuator unit 300 and detects the position of the second piton 320 as it comes into contact with the upper and lower surfaces of the forward and backward actuator unit 200 upwardly and downwardly moving by means of the up and down operating actuator unit 300.

5. A door valve according to claim 1, further comprising:
   a bellows 400 which is installed between the opening and closing member 10 and the forward and backward actuator unit 200 and between the forward and backward actuator unit 200 and the up and down operating actuator unit 300.

6. A door valve according to claim 1, further comprising:
an upper cover 301 and a lower cover 302 which are provided at the upper and lower sides of the up and down operating actuator unit 300 for the purpose sealing the second cylinder 30;
a guide part 303 which is formed at the upper cover 301 for guiding the upper and lower shaft 330; and
a bushing 304 which is installed in the interior of the guide part 303 and comes into contact with the outer surface of the upper and lower shaft 330 and prevents the abrasion of the upper and lower shaft 330 and the guide part 303 when eccentric phenomenon occurs due to the weight of the opening and closing member 100.

7. A door valve according to claim 1, wherein said check valve C1 is a quick exhaust valve.

\* \* \* \* \*